(12) United States Patent
Davidson

(10) Patent No.: US 11,165,420 B2
(45) Date of Patent: Nov. 2, 2021

(54) SWITCHING APPARATUS

(71) Applicant: GENERAL ELECTRIC TECHNOLOGY GMBH, Baden (CH)

(72) Inventor: Colin Charnock Davidson, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 16/617,237

(22) PCT Filed: Jun. 1, 2018

(86) PCT No.: PCT/EP2018/064421
§ 371 (c)(1),
(2) Date: Nov. 26, 2019

(87) PCT Pub. No.: WO2018/220157
PCT Pub. Date: Dec. 6, 2018

(65) Prior Publication Data
US 2020/0153424 A1     May 14, 2020

(30) Foreign Application Priority Data
Jun. 2, 2017 (EP) .................................... 17174300

(51) Int. Cl.
*H03K 17/00* (2006.01)
*H03K 17/10* (2006.01)
*H03K 17/26* (2006.01)
(52) U.S. Cl.
CPC ............. *H03K 17/10* (2013.01); *H03K 17/26* (2013.01); *H03K 2217/0081* (2013.01)
(58) Field of Classification Search
CPC . H03K 17/10; H03K 17/26; H03K 2217/0081
(Continued)

(56) References Cited

U.S. PATENT DOCUMENTS

2015/0002977 A1* 1/2015 Dupraz .................. H01H 9/542
361/115

FOREIGN PATENT DOCUMENTS

WO     20131131580 A1    9/2013
WO    WO 2013-131580    *   9/2013

OTHER PUBLICATIONS

International Search Report of PCT/EP2018/064421 dated Aug. 28, 2018.
(Continued)

*Primary Examiner* — Metasebia T Retebo
(74) *Attorney, Agent, or Firm* — Eversheds Sutherland (US) LLP

(57) ABSTRACT

There is provided a switching apparatus (30,130) comprising:
first and second nodes (32,34) operably connectable to a line voltage (44);
first and second switching branches (38,40) connected in parallel between the first and second nodes (32,34), the first switching branch (38) including at least one first switching element (46,60); and
the second switching branch (40) including a pair of switching assemblies connected in series between the first and second nodes (32,34), the second switching branch (40) further including a junction (48) between the pair of switching assemblies, each switching assembly including at least one second switching element (50), at least one of the switching assemblies further including at least one impedance element (52),
wherein the switching apparatus (30,130) further includes a shunt impedance (42) and a third node (36), the shunt impedance (42) arranged to form a permanent electrical connection between the junction (48) and the third node (36), the third node (36) operably connectable to a voltage that is different in magnitude to the line voltage
(Continued)

(44), the or each impedance element (52) arranged in the corresponding switching assembly to combine with the shunt impedance (36) so as to define a current path which extends between the corresponding first or second node (32,34) and the third node (36).

12 Claims, 2 Drawing Sheets

(58) Field of Classification Search
USPC .......................................................... 327/365
See application file for complete search history.

(56) References Cited

OTHER PUBLICATIONS

European Search Report for Application No. 17174300.8 dated Nov. 16, 2017.

\* cited by examiner

SWITCHING APPARATUS

CROSS-REFERENCE TO RELATED APPLICATIONS

This application is a U.S. National Stage Application under 35 U.S.C. 371 and claims the priority benefit of International Application No. PCT/EP2018/064421 filed Jun. 1, 2018, which claims priority to EP17174300.8, filed Jun. 2, 2017, which are both incorporated herein by reference.

TECHNICAL FIELD

The invention relates to a switching apparatus and to a circuit interruption device comprising such a switching apparatus, preferably for use in high voltage direct current applications.

BACKGROUND

It is known to use a switching apparatus that comprises a plurality of switches connected in parallel.

BRIEF SUMMARY OF DISCLOSURE

According to an aspect of the invention, there is provided a switching apparatus comprising:
first and second nodes operably connectable to a line voltage;
first and second switching branches connected in parallel between the first and second nodes, the first switching branch including at least one first switching element; and
the second switching branch including a pair of switching assemblies connected in series between the first and second nodes, the second switching branch further including a junction between the pair of switching assemblies, each switching assembly including at least one second switching element, at least one of the switching assemblies further including at least one impedance element,
wherein the switching apparatus further includes a shunt impedance and a third node, the shunt impedance arranged to form a permanent electrical connection between the junction and the third node, the third node operably connectable to a voltage that is different in magnitude to the line voltage, the or each impedance element arranged in the corresponding switching assembly to combine with the shunt impedance so as to define a current path which extends between the corresponding first or second node and the third node.

In use, the switching apparatus of the invention is configured as an 'in-line' switching apparatus by operably connecting the first and second nodes to the line voltage. During the operation of the switching apparatus of the invention, the first switching branch may be in a turned-on state while the second switching branch may be in a turned-off state. For example, the first and second switching branches may be configured so that the first switching branch is in a turned-on state and the second switching branch is in a turned-off state in a normal operating mode of the switching apparatus of the invention.

The provision of a permanently connected shunt impedance between the junction and the third node allows leakage current to flow through the or each defined current path when the first switching branch is in a turned-on state and the second switching branch is in a turned-off state. The flow of leakage current through the or each defined current path generates a voltage at the junction which is different from the line voltage, thereby causing a voltage to appear across the or each second switching element of each switching assembly.

The permanent connection of the shunt impedance between the junction and the third node provides the switching apparatus of the invention with a passive means of generating the voltage at the junction which is different from the line voltage.

It will be understood that the permanent electrical connection of the shunt impedance between the junction and the third node means that the shunt impedance cannot be switched out of circuit between the junction and the third node, i.e. the shunt impedance cannot be electrically isolated from the junction and the third node.

Preferably each switching assembly is configured to be capable of blocking both forward and reverse voltages when in an turned-off state. This is because, when a given switching assembly is incapable of blocking either a forward or reverse voltage (e.g. by way of a free-wheeling diode), the voltage at the junction may be clamped at the same potential as the voltage of the first or second node corresponding to the given switching assembly, thus preventing the flow of leakage current through the or each defined current path from generating a voltage at the junction which is different from the line voltage.

The generation of a voltage at the junction by way of the flow of leakage current through the or each defined current path provides the switching apparatus of the invention with several advantages when compared to a conventional switching apparatus. Exemplary advantages of the switching apparatus of the invention are described as follows.

The switching control unit of a switching element of a conventional switching apparatus may be powered by drawing power from a voltage across the switching element when it is in a turned-off state. On the other hand, when the conventional switching apparatus includes the turned-off switching element connected in parallel with another switching element that is in a turned-on state, there is no voltage across the turned-off switching element from which power can be drawn to drive the switching control unit.

Alternatively the switching control unit of a switching element of a conventional switching apparatus may be powered by drawing power from an external power source. For example, the switching control unit may be powered optically by using semiconductor lasers coupled via optical fibres to compact photovoltaic receivers. However, the use of an external power source to power the switching control unit of the switching element significantly adds to the operational complexity and cost of the conventional switching apparatus, especially when the conventional switching apparatus includes high numbers of switching elements.

In the switching apparatus of the invention, when leakage current flows through the or each defined current path, the voltage generated at the junction of the second switching branch may be used to drive the switching of the or each second switching element. More particularly, the consequential appearance of a voltage across the or each second switching element of each switching assembly provides a power source for powering the or each switching control unit of the switching apparatus of the invention.

In embodiments of the invention, the switching apparatus may include at least one switching control unit configured to control the switching of at least one of the second switching elements, the or each switching control unit may include a power supply circuit, and the power supply circuit of the or each switching control unit may be electrically coupled with one or more of the second switching elements so as to draw power from a voltage across the one or more second switching elements.

In such embodiments, the switching apparatus may include a plurality of switching control units, each switching control unit may be configured to control the switching of a respective one of the second switching elements, and the power supply circuit of each switching control unit may be electrically coupled with the respective second switching element so as to draw power from a voltage across the respective second switching element. This reduces the complexity of the configuration of the switching apparatus of the invention, particularly when each switching assembly is configured to include relatively high numbers of series-connected second switching elements to accommodate high voltage levels.

The configuration of the switching apparatus of the invention also permits measurement of the line voltage connected to the first and second nodes. Thus, in further embodiments of the invention, the switching apparatus may further include a measurement device configured to measure a voltage or current of the shunt impedance so as to measure, in use, the line voltage.

The first and second nodes may be operably connectable to a DC line voltage. This is so that the switching apparatus of the invention may be configured as a DC switching apparatus.

The third node may be operably connectable to ground. This provides a simple and reliable means of providing the third node with a voltage that is different in magnitude to the line voltage.

The type of switching element(s) used in each switching branch may vary depending on the requirements of the application in which the switching apparatus of the invention is used. The first switching branch may include: at least one DC circuit breaker; at least one DC commutating switch; at least one mechanical first switching element; and/or at least one electronic first switching element, preferably a semiconductor first switching element. At least one of the second switching elements may include: an electronic switch, preferably a semiconductor switch; or a gas tube switch.

The impedance value of the or each impedance element and the shunt impedance may vary depending on the requirements of the application in which the switching apparatus of the invention is used. The or each impedance value of each impedance element may be two or three orders of magnitude smaller than the impedance value of the shunt impedance. The or each impedance element may have an impedance value in the range of hundreds of kΩ and/or the shunt impedance has an impedance value in the range of tens or hundreds of MΩ.

The shunt impedance may include at least one insulated pipe electrically connected between the junction and the third node. The or each insulated pipe may form part of a water cooling system used for the switching apparatus of the invention, thus obviating the need to add an additional shunt impedance which would have increased the footprint of the switching apparatus of the invention.

The switching apparatus of the invention may be used in a wide range of applications which require parallel-connected first and second switching branches. For example, the switching apparatus of the invention may be configured as a circuit interruption device, and/or the switching apparatus of the invention may be configured for use in a DC power grid.

It will be appreciated that the use of the terms "first", "second", and the like, in this patent specification is merely intended to help distinguish between similar features (e.g. the first, second and third nodes; the first and second switching branches; the first and second switching elements) and is not intended to indicate the relative importance of one feature over another feature, unless otherwise specified.

BRIEF DESCRIPTION OF THE DRAWINGS

Preferred embodiments of the invention will now be described, by way of non-limiting examples, with reference to the accompanying drawings in which.

DETAILED DESCRIPTION

Figure 1:
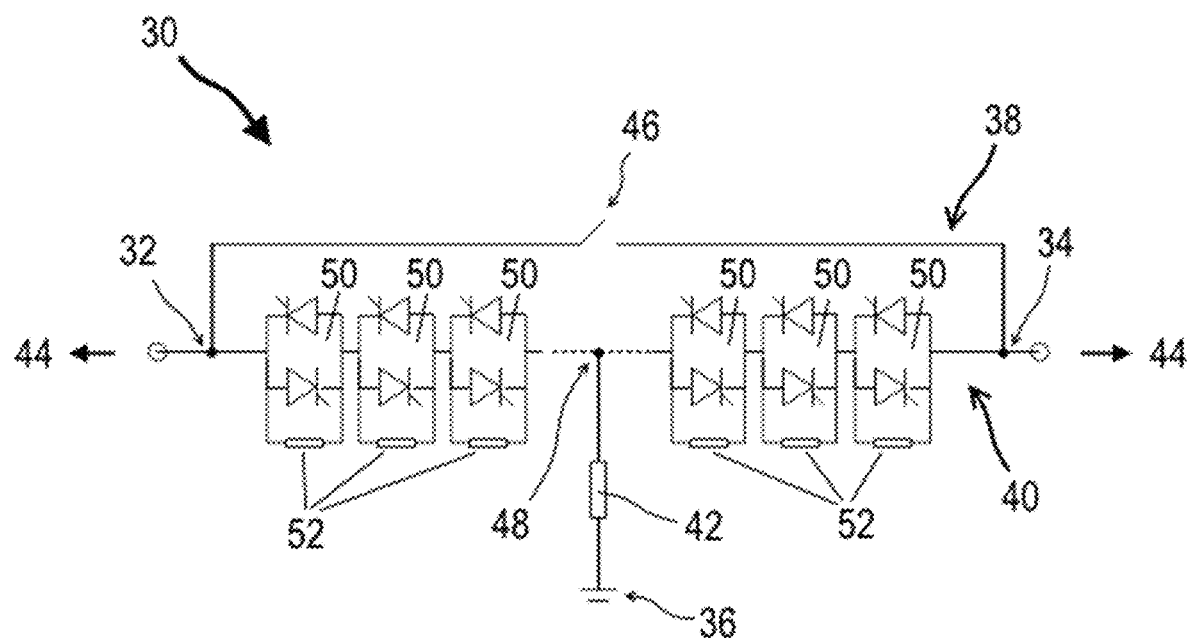
FIG. 1 shows schematically a switching apparatus according to a first embodiment of the invention.

A switching apparatus according to a first embodiment of the invention is shown in FIG. 1 and is designated generally by the reference numeral 30. The switching apparatus 30 comprises first, second and third nodes 32,34,36, first and second switching branches 38,40, and a shunt impedance.

In use, the first and second nodes 32,34 are operably connected to a DC line voltage 44 while the third node 36 is operably connected to ground. The first and second switching branches 38,40 are connected in parallel between the first and second nodes 32,34.

The first switching branch 38 includes a first switching element 46. It is envisaged that the configuration of the first switching element may vary as long as it is capable of opening under current and generating sufficient voltage to commutate current from the first switching branch to the second switching branch. For example, the first switching element may include at least one DC circuit breaker and/or at least one DC commutating switch.

The second switching branch 40 includes a pair of switching assemblies connected in series between the first and second nodes 32,34, and further includes a junction 48 between the pair of switching assemblies. Each switching assembly includes a plurality of series-connected second switching elements 50, where each second switching element 50 is in the form of a pair of thyristors connected in anti-parallel. Each switching assembly further includes a plurality of impedance elements, where each impedance element is in the form of a DC grading resistor 52 (e.g. of the order of 100 to 200 kΩ) connected in parallel with a respective one of the second switching elements 50.

The shunt impedance is in the form of a shunt resistor 42 (e.g. of the order of tens to hundreds of MΩ) which is arranged to form a permanent electrical connection between the junction 48 and the third node 36.

The arrangement of the DC grading resistors 52 in their respective switching assembly in combination with the permanent connection of the shunt resistor 42 between the junction 48 and the third node 36 defines a respective current path, with a first current path extending between the first and third nodes 32,36, and with a second current path extending between the second and third nodes 32,36.

Figure 2:
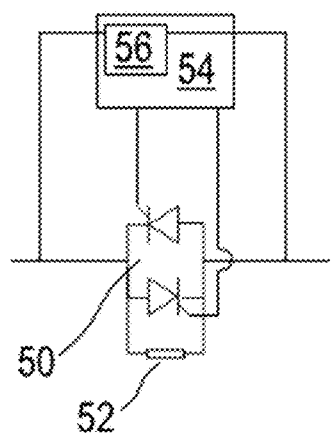
FIG. 2 shows schematically a switching control unit of the switching apparatus of FIG. 1.

The switching apparatus 30 further includes a plurality of gate drive units 54. FIG. 2 shows the implementation of a given gate drive unit 54 in the switching apparatus 30. Each gate drive unit 54 is configured to supply a trigger signal to the gate of the respective thyristor in order to turn on the respective thyristor. Each gate drive unit 54 includes a power supply circuit 56 that is electrically coupled with the respective thyristor so as to draw power from a voltage across the respective second switching element 50.

During the normal operation of the switching apparatus 30, the first switching element 46 is closed while the thyristors of the switching assemblies are open. Hence, at one point during the operation of the switching apparatus 30, the first switching branch 38 is in a turned-on state and the second switching branch 40 is in a turned-off state. At this stage the first and second nodes 32,34 are at the same potential, i.e. the DC line voltage 44, which means that there is no voltage across the turned-off second switching branch 40.

During a fault operation of the switching apparatus 30, it may be necessary to reconfigure the switching apparatus 30 so that the first switching branch 38 is in a turned-off state and the second switching branch 40 is in a turned-on state in order to commutate current from the first switching branch 38 to the second switching branch 40.

As mentioned above, when a conventional switching apparatus includes a turned-off switching element connected in parallel with another switching element that is in a turned-on state, there is no voltage across the turned-off switching element from which power can be drawn to drive a switching control unit.

Thus, in this embodiment, the lack of a voltage across the turned-off second switching branch 40 would normally prevent power from being drawn from the turned-off second switching branch 40 in order to power the gate drive units 54 of the thyristors, thus requiring the use of a complex and expensive external power source such as optical powering.

On the other hand the permanent connection of the shunt resistor 42 between the junction 48 and the third node 36 provides the switching apparatus 30 with a passive self-powering means for deriving power from the second switching branch 40 in order to power the gate drive units 54 of the thyristors, thus obviating the need for a complex and expensive external power source.

Figure 3:
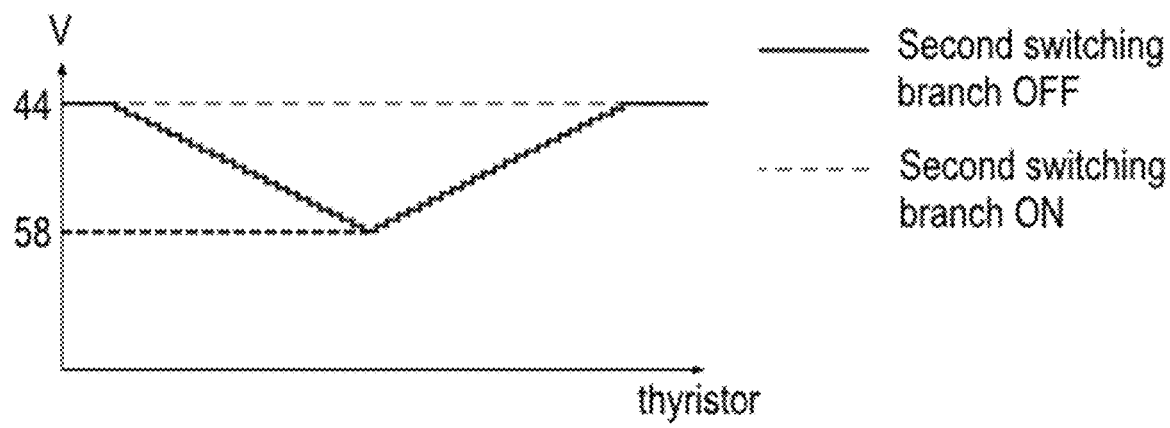
FIG. 3 shows graphically a distribution of voltages across a plurality of switching elements of the switching apparatus of FIG. 1.

When the first switching branch 38 is in the turned-on state and the second switching branch 40 is in the turned-off state, leakage current flows through each defined current path from each of the first and second nodes 32,34 to the ground-connected third node 36. FIG. 3 shows that the flow of leakage current through the DC grading resistors 52 and the shunt resistor 42 drops the voltage 58 at the junction 48 to a level below the DC line voltage 44, thus enabling a small voltage to be dropped across each second switching element 50. The resulting voltage across each second switching element 50 therefore enables the power supply circuits 56 of the gate drive units 54 to draw the required power in order to enable the gate drive units 54 to turn on the thyristors.

After the first switching element 46 is turned off and the thyristors are turned on, the first and second nodes 32,34 are connected to each other via the second switching branch 40 such that the voltage 58 at the junction 48 is forced to be at the same potential as the DC line voltage 44 as shown in FIG. 3. At this stage the shunt resistor 42 does not have any effect on the voltage 58 at the junction 48.

The operating parameters of the switching apparatus 30 of FIG. 1 are comparable to typical operating parameters of equipment used in DC power grids.

For example, when the first and second nodes 32,34 are connected to a DC line voltage 44 of 500 kV, the second switching branch 40 requires about 100 thyristor levels (i.e. about 100 series-connected second switching elements 50) if the second switching branch 40 is required to transiently withstand a voltage of 750 kV when in an turned-off state. Assuming a respective 100 kΩ DC grading resistor 52 is connected in anti-parallel with each second switching element 50, each switching assembly has a resistance of 5 MΩ. In order to drop about 500 V across each second switching element 50 and bring the voltage 58 at the junction 48 down to 475 kV, the leakage current flowing through each defined current path is 5 mA, and hence the combined leakage current flowing through the shunt resistor 42 will be 10 mA. The shunt resistor 42 will therefore be required to have an ohmic value of 47.5 MO. The power dissipation in the shunt resistor 42, in steady-state, will be 5.3 kW.

The above exemplary numerical values for the operating parameters of the switching apparatus 30 are of the same order of magnitude as for a DC voltage divider used for measuring DC power grid voltages for control/protection purposes. Thus, the switching apparatus 30 of FIG. 1 is compatible for use in existing DC power grids.

The configuration of the DC grading resistors 52 and the shunt resistor 42 in the switching apparatus 30 of FIG. 1 further provides a voltage divider structure that can be used to measure the DC line voltage 44 during the operation of the switching apparatus 30. A measurement device may be used to measure a voltage or current of the shunt resistor 42 so as to enable the measurement of the DC line voltage 44.

Optionally, when water cooling is required to cool the thyristors of the second switching branch 40, insulating pipes of the water cooling system may be electrically connected between the junction 48 and the ground-connected third node 36 in order to function as the shunt impedance. This allows the shunt resistor 42 to be omitted from the switching apparatus 30.

Figure 4:
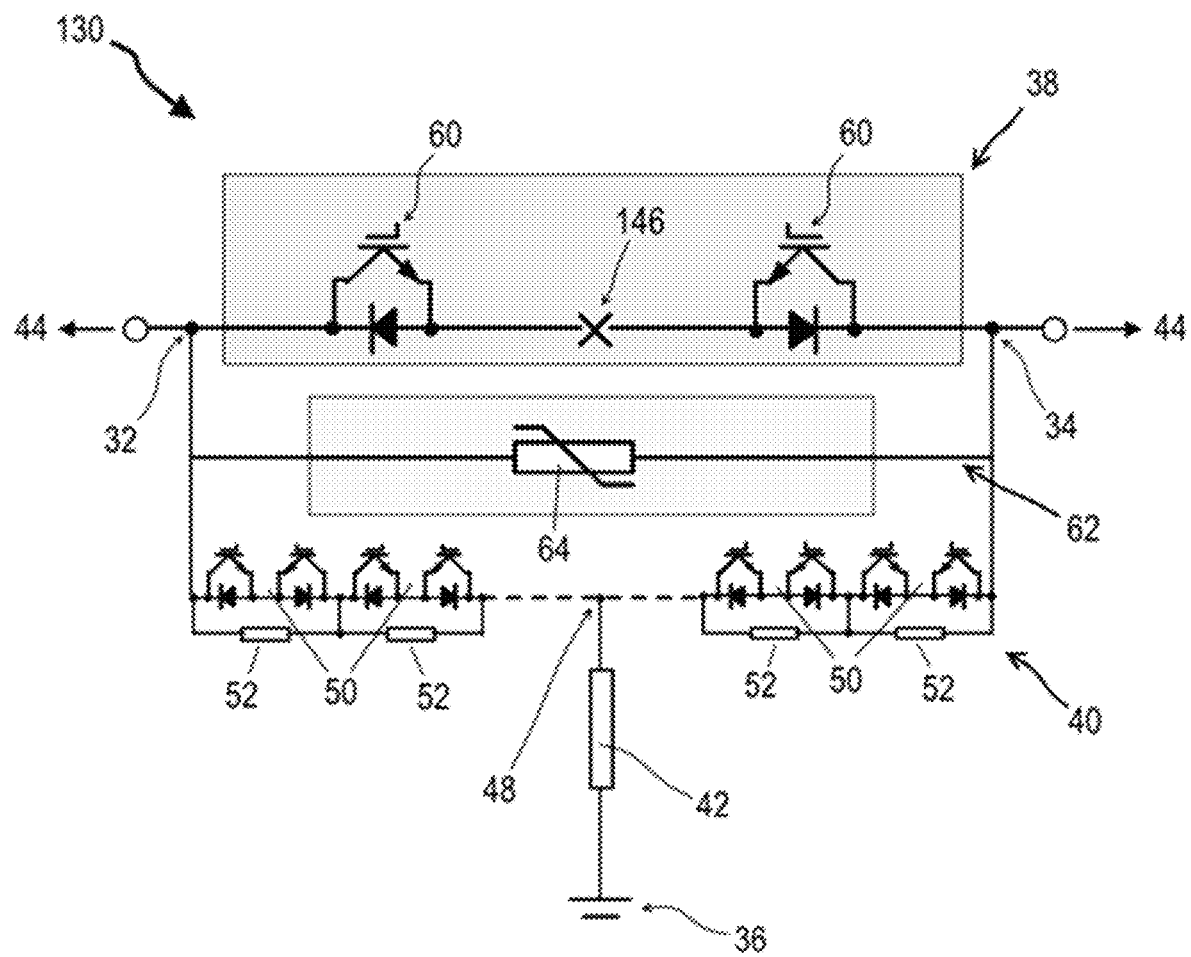
FIG. 4 shows schematically a switching apparatus according to a second embodiment of the invention.

A switching apparatus according to a second embodiment of the invention is shown in FIG. 4 and is designated generally by the reference numeral 130. The switching apparatus of FIG. 4 is similar in structure and operation to the switching apparatus 30 of FIG. 1, and like features share the same reference numerals.

The switching apparatus of FIG. 4 differs from the switching apparatus 30 of FIG. 1 in that the switching apparatus of FIG. 4 is configured as a DC circuit breaker with the following features:

- the first switching branch 38 includes a pair of inverse series connected insulated gate bipolar transistors (IGBT) 60 connected in series with a mechanical switch 146;
- each second switching element 50 is in the form of a pair of inverse series connected IGBTs, instead of an anti-parallel pair of thyristors; and
- a third branch 62 with a surge arrester 64 is connected in parallel with the first and second switching branches 38,40 between the first and second nodes 32,34.

In use, the first and second nodes 32,34 are connected to a DC line voltage 44 of a DC network.

During the normal operation of the DC network, the first switching branch 38 is in a turned-on state such that current flows through the first switching branch 38 in a normal operating mode of the switching apparatus 130. Meanwhile each second switching element 50 is turned off such that the second switching branch 40 is in a turned-off state.

A fault or other abnormal operating condition in the DC network may lead to high fault current flowing through the DC network.

In response to an event of high fault current in the DC network, the IGBTs 60 of the first switching branch 38 are turned off and the second switching elements 50 of the second switching branch 40 are turned on in order to commutate current from the first switching branch 38 to the second switching branch 40 in a fault mode of operation of the switching apparatus 130.

The turn-on of the IGBTs of the second switching branch 40 in the switching apparatus 130 of FIG. 4 is carried out in the same way as the turn-on of the thyristors in the switching apparatus 30 of FIG. 1. More specifically, when the first switching branch 38 is in the turned-on state and the second switching branch 40 is in the turned-off state, the flow of leakage current through the DC grading resistors 52 and the shunt resistor 42 drops the voltage at the junction 48 to a level below the DC line voltage 44, thus enabling a small voltage to be dropped across each second switching element 50 which in turn enables the power supply circuits 56 of the gate drive units 54 to draw the required power in order to enable the gate drive units 54 to turn on the IGBTs of the second switching elements 50.

After the first switching branch 38 is confirmed to be in a turned-off state, the second switching elements 50 of the second switching branch 40 are turned off to commutate the fault current from the second switching branch 40 to the third branch 62. This enables the surge arrester 64 of the third branch 62 to act to limit both a maximum voltage and a rate of rise of voltage across the switching apparatus 130, thus interrupting the fault current flowing through the DC network.

It will be appreciated that each numerical value given for the embodiments shown is merely chosen to help illustrate the working of the invention, and may be replaced by another numerical value.

It will be appreciated that each topology of the switching apparatus 30,130 in the embodiments shown is merely chosen to help illustrate the working of the invention, and may be replaced by another type of topology depending on the requirements of the application in which the switching apparatus 30,130 of the invention is used.

It is envisaged that, in other embodiments of the invention, each second switching element 50 in the second switching branch 40 may be replaced by another type of switching element that is configured to be capable of blocking both forward and reverse voltages when in an turned-off state.

The number and type of switching element(s) used in each switching branch 38,40 may vary depending on the requirements of the application in which the switching apparatus 30,130 of the invention is used. The first switching branch 38 may include at least one electronic first switching element but omit any mechanical first switching element. The first switching branch may include a single first switching element or a plurality of series-connected first switching elements. Each of the thyristors of FIG. 1 and the IGBTs of FIG. 2 may be replaced by a different type of electronic switch, preferably a semiconductor switch, or by a gas tube switch.

The invention claimed is:

1. A switching apparatus comprising:
   first and second nodes operably connectable to a line voltage;
   first and second switching branches connected in parallel between the first and second nodes, the first switching branch including at least one first switching element, wherein the first switching element includes: at least one DC circuit breaker; at least one DC commutating switch; at least one mechanical first switching element; and/or at least one electronic first switching element, preferably a semiconductor first switching element; and
   the second switching branch including a pair of switching assemblies connected in series between the first and second nodes, the second switching branch further including a junction between the pair of switching assemblies, each switching assembly including at least one second switching element, at least one of the switching assemblies further including at least one impedance element connected in parallel to the second switching element,
   wherein the switching apparatus further includes a shunt impedance and a third node that is operably connected to ground, the shunt impedance directly connected to the junction and the third node, the shunt impedance arranged to form a permanent electrical connection between the junction and the third node, the third node operably connectable to a voltage that is different in magnitude to the line voltage, the or each impedance element arranged in the corresponding switching assembly to combine with the shunt impedance so as to define a current path which extends between the corresponding first or second node and the third node; and
   wherein the first and second switching branches are configured so that the first switching branch is in a turned-on state and the second switching branch is in a turned-off state in a normal operating mode of the switching apparatus.

2. The switching apparatus according to claim 1, wherein each switching assembly is configured to be capable of blocking both forward and reverse voltages when in an turned-off state.

3. The switching apparatus according to claim 1, wherein the switching apparatus includes at least one switching control unit configured to control the switching of at least one of the second switching elements, the or each switching control unit includes a power supply circuit, and the power supply circuit of the or each switching control unit is electrically coupled with one or more of the second switching elements so as to draw power from a voltage across the one or more second switching elements.

4. The switching apparatus according to claim 3, wherein the switching apparatus includes a plurality of switching control units, each switching control unit is configured to control the switching of a respective one of the second switching elements, and the power supply circuit of each switching control unit is electrically coupled with the respective second switching element so as to draw power from a voltage across the respective second switching element.

5. The switching apparatus according to claim 1, further including a measurement device configured to measure a voltage or current of the shunt impedance so as to measure, in use, the line voltage.

6. The switching apparatus according to claim 1, wherein the first and second nodes are operably connectable to a DC line voltage.

7. The switching apparatus according to claim 1, wherein at least one of the second switching elements includes: an electronic switch, preferably a semiconductor switch; or a gas tube switch.

8. The switching apparatus according to claim 1, wherein the impedance value of the or each impedance element is two or three orders of magnitude smaller than the impedance value of the shunt impedance.

9. The switching apparatus according to claim 1, wherein the or each impedance element has an impedance value in the range of hundreds of k$\Omega$ and/or wherein the shunt impedance has an impedance value in the range of tens or hundreds of M$\Omega$.

10. The switching apparatus according to claim 1, wherein the shunt impedance includes at least one insulated pipe electrically connected between the junction and the third node.

11. The switching apparatus according to claim 1, wherein the switching apparatus is configured as a circuit interruption device and/or wherein the switching apparatus of the invention is configured for use in a DC power grid.

12. The switching apparatus according to claim 1, wherein the first switching element includes a pair of inverse series connected insulated gate bipolar transistors (IGBT) connected in series with a mechanical switch.

* * * * *